(12) United States Patent
Chen

(10) Patent No.: US 11,239,153 B2
(45) Date of Patent: Feb. 1, 2022

(54) MIM CAPACITOR OF EMBEDDED STRUCTURE AND METHOD FOR MAKING THE SAME

(71) Applicant: Hua Hong Semiconductor (Wuxi) Limited, Wuxi (CN)

(72) Inventor: Yu Chen, Wuxi (CN)

(73) Assignee: Hua Hong Semiconductor (Wuxi) Limited, Wuxi (CN)

( * ) Notice: Subject to any disclaimer, the term of this patent is extended or adjusted under 35 U.S.C. 154(b) by 0 days.

(21) Appl. No.: 17/122,265

(22) Filed: Dec. 15, 2020

(65) Prior Publication Data

US 2021/0202376 A1 Jul. 1, 2021

(30) Foreign Application Priority Data

Dec. 26, 2019 (CN) .......................... 201911363247.9

(51) Int. Cl.
*H01L 23/522* (2006.01)
*H01L 21/768* (2006.01)
*H01L 49/02* (2006.01)

(52) U.S. Cl.
CPC .... *H01L 23/5223* (2013.01); *H01L 21/76877* (2013.01); *H01L 28/60* (2013.01)

(58) Field of Classification Search
CPC ............. H01L 21/768; H01L 21/76877; H01L 21/76897; H01L 23/52; H01L 23/5222; H01L 23/5223; H01L 23/5226; H01L 23/528; H01L 23/53204; H01L 23/5329; H01L 27/08; H01L 27/0805; H01L 27/10844; H01L 27/1085; H01L 27/10852; H01L 27/10855; H01L 27/10858; H01L 28/40; H01L 28/60; H01L 28/75; H01L 29/66; H01L 29/66007; H01L 29/86; H01L 29/92; H01G 4/005; H01G 4/008; H01G 4/018
See application file for complete search history.

(56) References Cited

U.S. PATENT DOCUMENTS

2011/0210422 A1* 9/2011 Imamura ................ H01L 28/60
257/532

* cited by examiner

*Primary Examiner* — Cheung Lee
(74) *Attorney, Agent, or Firm* — MKG, LLC

(57) ABSTRACT

The present application has disclosed an MIM capacitor of an embedded structure, wherein an interlayer film is formed between a first metal wire layer and a second metal wire layer; the MIM capacitor is formed on the surface of the interlayer film; a capacitor lower electrode is connected to the first metal wire layer by means of a bottom first via, the first metal wire layer is connected, by means of a second via outside the capacitor lower electrode, to a lower electrode lead-out structure formed by the second metal wire layer; and an upper electrode lead-out structure formed by the second metal wire layer covers the surface of the capacitor upper electrode of the MIM capacitor. The present application has further disclosed a method for manufacturing an MIM capacitor of an embedded structure. In the present application, the performance and stability of the capacitor can be improved.

15 Claims, 4 Drawing Sheets

MIM CAPACITOR OF EMBEDDED STRUCTURE AND METHOD FOR MAKING THE SAME

CROSS-REFERENCES TO RELATED APPLICATIONS

This application claims priority to Chinese patent application number 201911363247.9 filed at CNIPA on Dec. 26, 2019, and entitled "MIM CAPACITOR OF EMBEDDED STRUCTURE AND METHOD FOR MAKING THE SAME", the disclosure of which is incorporated by reference herein its entirely.

TECHNICAL FIELD

The present application relates to the field of semiconductor integrated circuit manufacturing, in particular to an MIM capacitor of an embedded structure; and the present application further relates to a method for manufacturing an MIM capacitor of an embedded structure.

BACKGROUND

Referring to FIG. 1, which is a structural schematic view of an existing MIM capacitor of an embedded structure, it can be seen that the existing MIM capacitor of an embedded structure is formed between a first metal wire layer 101 and a second metal wire layer 106 arranged in the upper-lower adjacent manner.

The first metal wire layer 101 directly serves as a capacitor lower electrode of the MIM capacitor.

In a formation region of the MIM capacitor, a capacitor insulating dielectric layer 102 and a capacitor upper electrode 103 are sequentially formed on the surface of the first metal wire layer 101.

An interlayer film 104 covers the surface of the first metal wire layer 101 on which the capacitor insulating dielectric layer 102 and the capacitor upper electrode 103 are formed and the surface of an outer region of the first metal wire layer 101.

The patterned structure of the second metal wire layer 106 includes a lower electrode lead-out structure 106b and an upper electrode lead-out structure 106a.

Vias passing through the interlayer film 104 include vias 105a and 105b.

The capacitor upper electrode 103 is connected to the upper electrode lead-out structure 106a by means of the via 105a. The via 105b is located on the top of the first metal wire layer 101 extending to the outside of the MIM capacitor, and the top of the via 105b is connected to the lower electrode lead-out structure 106b.

It can be seen from FIG. 1 that the depths of the vias 105a and 105b are different, and openings of the vias 105a and 105b are usually formed at the same time by means of the same etching process. Therefore, the via 105a usually undergoes over-etching, and it is not easy to control the amount of over-etching, finally imposing adverse impacts on the performance and reliability of the MIM capacitor.

BRIEF SUMMARY

The technical problem to be solved by the present application is to provide an MIM capacitor of an embedded structure, to improve the performance and reliability of the capacitor. To this end, the present application further provides a method for manufacturing an MIM capacitor of an embedded structure.

In order to solve the above technical problem, the MIM capacitor of an embedded structure provided in the present application is formed between a first metal wire layer and a second metal wire layer arranged in an upper-lower adjacent manner.

An interlayer film is formed between the first metal wire layer and the second metal wire layer.

The MIM capacitor is formed on the surface of the interlayer film and comprises a capacitor lower electrode, a capacitor insulating dielectric layer, and a capacitor upper electrode that are sequentially stacked.

The capacitor lower electrode is connected to the first metal wire layer by means of a first via passing through the interlayer film, the first metal wire layer extends to the outside of the capacitor lower electrode, and the first metal wire layer is connected, by means of a second via outside the capacitor lower electrode and passing through the interlayer film, to a lower electrode lead-out structure formed by the second metal wire layer.

A side wall is formed on a side face of the MIM capacitor.

A patterned structure of the second metal wire layer comprises the lower electrode lead-out structure and an upper electrode lead-out structure.

The upper electrode lead-out structure covers the surface of the capacitor upper electrode of the MIM capacitor and extends to the surface of the interlayer film outside the MIM capacitor, and the upper electrode lead-out structure is isolated from the capacitor lower electrode by means of the side wall.

In a further improvement, the material of the capacitor lower electrode comprises metal or a conductive dielectric layer.

In a further improvement, the metal material of the capacitor lower electrode comprises Al, Cu, or TiN.

In a further improvement, the material of the capacitor insulating dielectric layer comprises silicon oxide or silicon nitride.

In a further improvement, the material of the capacitor upper electrode comprises metal.

In a further improvement, the metal material of the capacitor upper electrode comprises Al, Cu, or TiN.

In a further improvement, the metal materials of the first metal wire layer and the second metal wire layer are same and comprise Al or Cu.

In a further improvement, the material of the interlayer film comprises silicon oxide or a low-K material layer; and the material of the side wall comprises silicon oxide or silicon nitride.

In order to solve the above technical problem, the method for manufacturing an MIM capacitor of an embedded structure provided in the present application comprises the following steps:

step 1: forming a first front metal layer on a semiconductor substrate, and patterning the first front metal layer to form a first metal wire layer;

step 2: forming an interlayer film on the semiconductor substrate on which the first metal wire layer is formed;

step 3: forming, in the interlayer film, vias passing through the interlayer film, the vias comprising a first via and a second via;

step 4: sequentially forming a capacitor lower electrode, a capacitor insulating dielectric layer, and a capacitor upper electrode on the surface of the interlayer film;

step 5: defining a formation region of an MIM capacitor by means of photolithography, and removing the capacitor upper electrode, the capacitor insulating dielectric layer, and the capacitor lower electrode outside the formation region of the MIM capacitor by means of an etching process, such that the capacitor upper electrode, the capacitor insulating dielectric layer, and the capacitor lower electrode remaining in the formation region of the MIM capacitor are stacked to form the MIM capacitor;

wherein the capacitor lower electrode is connected to the first metal wire layer by means of the first via; and the second via is located on the top of the first metal wire layer extending to the outside of the capacitor lower electrode;

step 6: forming a side wall on a side face of the MIM capacitor; and step 7: forming a second front metal layer, and patterning the second front metal layer to form a second metal wire layer.

A patterned structure of the second metal wire layer comprises a lower electrode lead-out structure and an upper electrode lead-out structure;

The bottom of the lower electrode lead-out structure is in contact with the second via and connected to the first metal wire layer by means of the second via.

The upper electrode lead-out structure covers the surface of the capacitor upper electrode of the MIM capacitor and extends to the surface of the interlayer film outside the MIM capacitor, and the upper electrode lead-out structure is isolated from the capacitor lower electrode by means of the side wall.

In a further improvement, the material of the capacitor lower electrode comprises metal or a conductive dielectric layer.

In a further improvement, the metal material of the capacitor lower electrode comprises Al, Cu, or TiN.

In a further improvement, the material of the capacitor insulating dielectric layer comprises silicon oxide or silicon nitride.

In a further improvement, the material of the capacitor upper electrode comprises metal.

In a further improvement, the metal material of the capacitor upper electrode comprises Al, Cu, or TiN.

In a further improvement, the metal material of the first metal wire layer comprises Al or Cu, and the metal material of the second metal wire layer comprises Al or Cu.

The material of the interlayer film comprises silicon oxide or a low-K material layer.

The material of the side wall comprises silicon oxide or silicon nitride.

In step 1, the semiconductor substrate comprises a silicon substrate, a semiconductor device is formed in the semiconductor substrate, more than one layer of bottom interlayer film is formed in the semiconductor substrate before the first front metal layer is formed, and a corresponding bottom front metal layer is formed between the bottom interlayer films.

The MIM capacitor of the present application adopts a stack structure of the capacitor lower electrode, the capacitor insulating dielectric layer, and the capacitor upper electrode formed on the interlayer film. Unlike the prior art in which the capacitor lower electrode is directly in contact with the bottom metal wire and the capacitor upper electrode is connected to the top metal wire by means of the via passing through the interlayer film, in the present application, the capacitor lower electrode is connected to the bottom first metal wire layer by means of the via, the capacitor upper electrode is directly in contact with the top second metal wire layer, and additionally, the side wall is formed on the side face of the MIM capacitor, to isolate the capacitor lower electrode from the second metal wire layer while it is ensured that the capacitor upper electrode is in contact with the second metal wire layer. In the structure of the present application, the MIM capacitor is directly located on the surface of the interlayer film, and no via needs to be formed on the top of the MIM capacitor, thereby avoiding an adverse impact imposed by the via on the MIM capacitor, for example, an etching impact on the capacitor upper electrode or the capacitor insulating dielectric layer of the MIM capacitor resulting from an etching process for forming an opening of the via. Therefore, in the present application, the performance and reliability of the capacitor can be improved.

BRIEF DESCRIPTION OF THE DRAWINGS

The present application will be further described in detail below with reference to the drawings and specific implementations.

DETAILED DESCRIPTION OF THE DISCLOSURE

Figure 1:
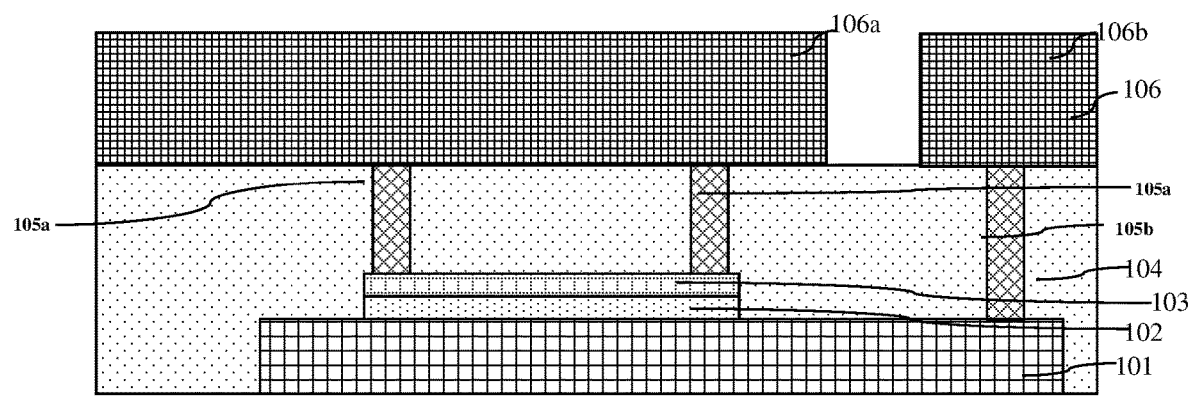
FIG. 1 is a structural schematic view of an existing MIM capacitor of an embedded structure.
Figure 2:
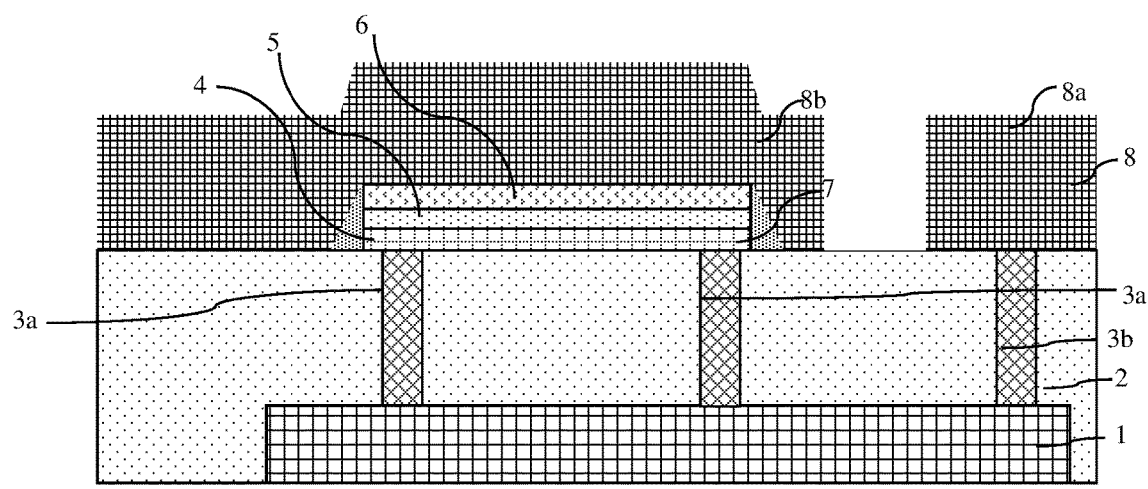
FIG. 2 is a structural schematic view of an MIM capacitor of an embedded structure in an embodiment of the present application.

Referring to FIG. 2, which is a structural schematic view of an MIM capacitor of an embedded structure in an embodiment of the present application, it can be seen that the MIM capacitor of an embedded structure in the embodiment of the present application is formed between a first metal wire layer 1 and a second metal wire layer 8 arranged in an upper-lower adjacent manner.

An interlayer film 2 is formed between the first metal wire layer 1 and the second metal wire layer 8.

Generally, the first metal wire layer 1 is formed on a semiconductor substrate. The semiconductor substrate includes a silicon substrate, a semiconductor device is formed in the semiconductor substrate, more than one layer of bottom interlayer film is formed in the semiconductor substrate before the first front metal layer is formed, and a corresponding bottom front metal layer is formed between the bottom interlayer films.

The MIM capacitor is formed on the surface of the interlayer film 2 and includes a capacitor lower electrode 4, a capacitor insulating dielectric layer 5, and a capacitor upper electrode 6 that are sequentially stacked.

The capacitor lower electrode 4 is connected to the first metal wire layer 1 by means of a first via 3a passing through the interlayer film 2, the first metal wire layer 1 extends to the outside of the capacitor lower electrode 4, and the first metal wire layer 1 is connected, by means of a second via 3b outside the capacitor lower electrode 4 and passing through the interlayer film 2, to a lower electrode lead-out structure 8a formed by the second metal wire layer 8.

A side wall 7 is formed on a side face of the MIM capacitor.

A patterned structure of the second metal wire layer 8 includes the lower electrode lead-out structure 8a and an upper electrode lead-out structure 8b.

The upper electrode lead-out structure 8b covers the surface of the capacitor upper electrode 6 of the MIM capacitor and extends to the surface of the interlayer film 2 outside the MIM capacitor, and the upper electrode lead-out structure 8b is isolated from the capacitor lower electrode 4 by means of the side wall 7.

In the embodiment of the present application, the material of the capacitor lower electrode 4 includes metal or a conductive dielectric layer. In some examples, the metal material of the capacitor lower electrode 4 includes Al, Cu, or TiN.

The material of the capacitor insulating dielectric layer 5 includes silicon oxide or silicon nitride.

The material of the capacitor upper electrode 6 includes metal. In some examples, the metal material of the capacitor upper electrode 6 includes Al, Cu, or TiN.

The metal material of the first metal wire layer 1 includes Al or Cu, and the metal material of the second metal wire layer 8 includes Al or Cu.

The material of the interlayer film 2 is silicon oxide. In other embodiments, the material of the interlayer film 2 can be a low-K material layer.

The material of the side wall 7 includes silicon oxide or silicon nitride.

The MIM capacitor in the embodiment of the present application adopts a stack structure of the capacitor lower electrode 4, the capacitor insulating dielectric layer 5, and the capacitor upper electrode 6 formed on the interlayer film 2. Unlike the prior art in which the capacitor lower electrode 4 is directly in contact with the bottom metal wire and the capacitor upper electrode 6 is connected to the top metal wire by means of the via passing through the interlayer film 2, in the embodiment of the present application, the capacitor lower electrode 4 is connected to the bottom first metal wire layer 1 by means of the via, the capacitor upper electrode 6 is directly in contact with the top second metal wire layer 8, and additionally, the side wall 7 is formed on the side face of the MIM capacitor, to isolate the capacitor lower electrode 4 from the second metal wire layer 8 while it is ensured that the capacitor upper electrode 6 is in contact with the second metal wire layer 8. In the structure of the embodiment of the present application, the MIM capacitor is directly located on the surface of the interlayer film 2, and no via needs to be formed on the top of the MIM capacitor, thereby avoiding an adverse impact imposed by the via on the MIM capacitor, for example, an etching impact on the capacitor upper electrode 6 or the capacitor insulating dielectric layer 5 of the MIM capacitor resulting from an etching process for forming an opening of the via. Therefore, in the embodiment of the present application, the performance and reliability of the capacitor can be improved.

Figure 3A:
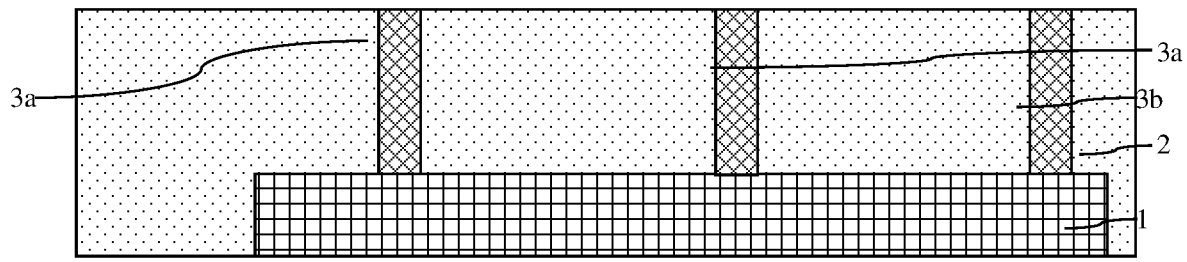
FIGS. 3A-3F are schematic views of a device structure in each step of a method for manufacturing an MIM capacitor of an embedded structure in an embodiment of the present application.

Referring to FIGS. 3A-3F, which are schematic views of a device structure in each step of a method for manufacturing an MIM capacitor of an embedded structure in an embodiment of the present application, it can be seen that the method for manufacturing an MIM capacitor of an embedded structure in the embodiment of the present application includes the following steps:

Step 1: Referring to FIG. 3A, a first front metal layer is formed on a semiconductor substrate, and the first front metal layer is patterned to form a first metal wire layer 1.

The metal material of the first metal wire layer 1 includes Al or Cu.

The semiconductor substrate includes a silicon substrate, a semiconductor device is formed in the semiconductor substrate, more than one layer of bottom interlayer film is formed in the semiconductor substrate before the first front metal layer is formed, and a corresponding bottom front metal layer is formed between the bottom interlayer films.

Step 2: Referring to FIG. 3A, an interlayer film 2 is formed on the semiconductor substrate on which the first metal wire layer 1 is formed.

The material of the interlayer film 2 includes silicon oxide or a low-K material layer.

Step 3: Referring to FIG. 3A, vias passing through the interlayer film 2 are formed in the interlayer film 2, wherein the vias include a first via 3a and a second via 3b.

Figure 3B:
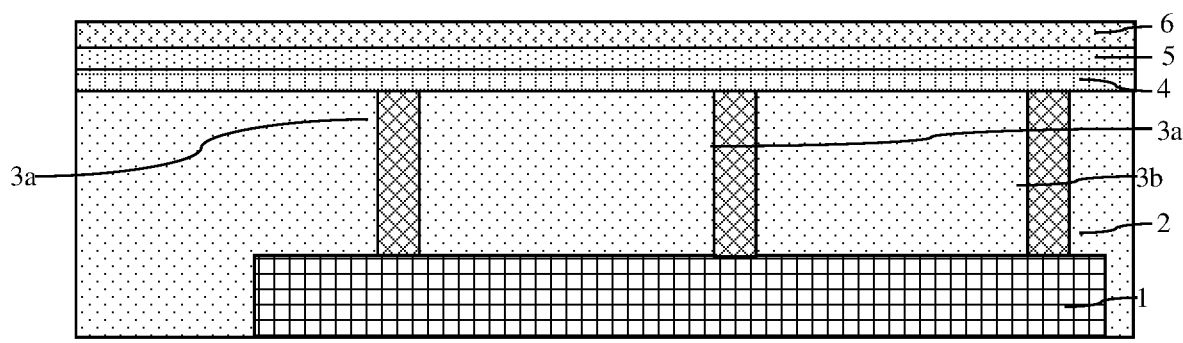

Step 4: Referring to FIG. 3B, a capacitor lower electrode 4, a capacitor insulating dielectric layer 5, and a capacitor upper electrode 6 are sequentially formed on the surface of the interlayer film 2.

The material of the capacitor lower electrode 4 includes metal or a conductive dielectric layer. In some examples, the metal material of the capacitor lower electrode 4 includes Al, Cu, or TiN.

The material of the capacitor insulating dielectric layer 5 includes silicon oxide or silicon nitride.

The material of the capacitor upper electrode 6 includes metal. In some examples, the metal material of the capacitor upper electrode 6 includes Al, Cu, or TiN.

Figure 3C:
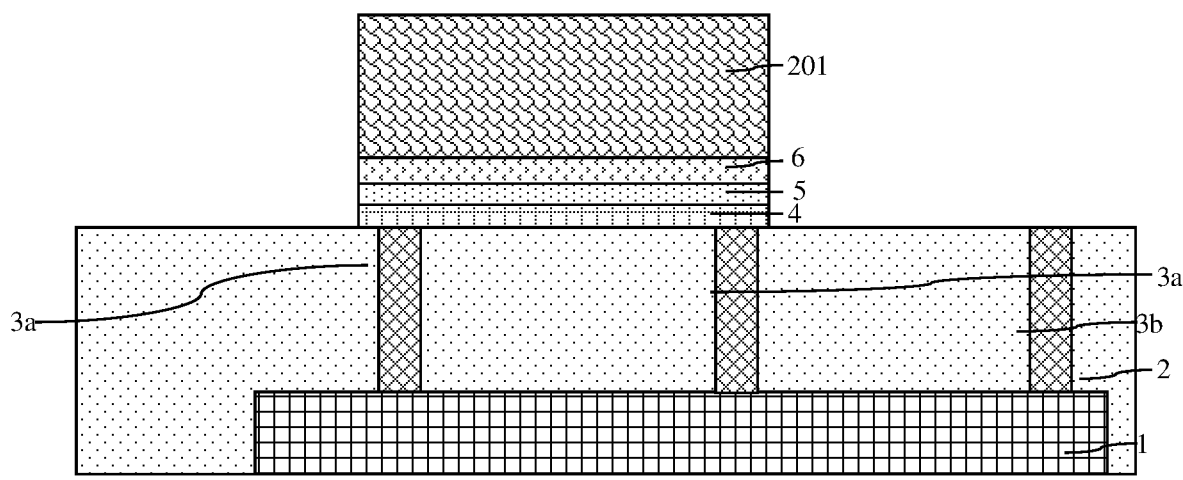

Step 5: Referring to FIG. 3C, a photoresist pattern 201 is formed by means of a photolithography process to define a formation region of an MIM capacitor, and the capacitor upper electrode 6, the capacitor insulating dielectric layer 5, and the capacitor lower electrode 4 outside the formation region of the MIM capacitor are removed by means of an etching process, such that the capacitor upper electrode 6, the capacitor insulating dielectric layer 5, and the capacitor lower electrode 4 remaining in the formation region of the MIM capacitor are stacked to form the MIM capacitor.

The capacitor lower electrode 4 is connected to the first metal wire layer 1 by means of the first via 3a.

The second via 3b is located on the top of the first metal wire layer 1 extending to the outside of the capacitor lower electrode 4.

Then, the photoresist pattern 201 is removed.

Figure 3D:
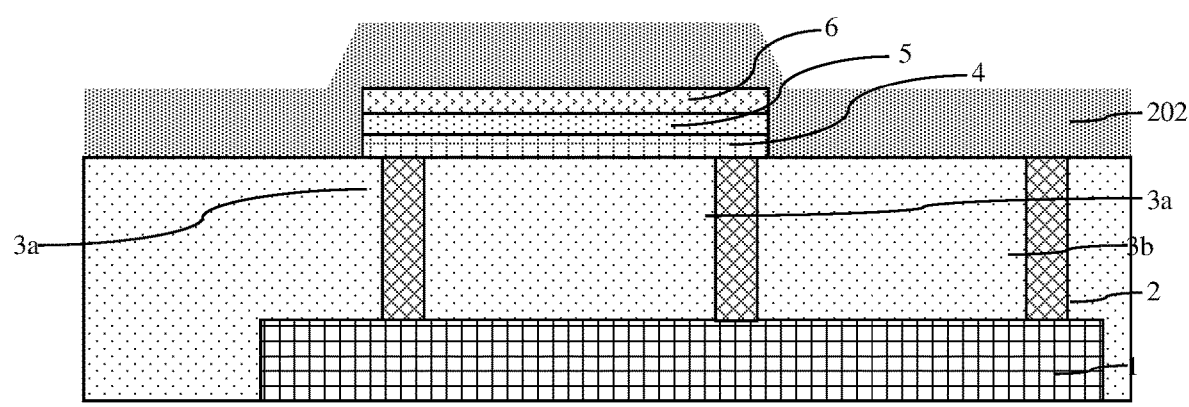

Step 6: Referring to FIG. 3D, a side wall material layer 202 is formed by means of deposition, wherein the side wall material layer 202 covers front and side faces of the MIM capacitor and the outside surface of the MIM capacitor.

The material of the side wall material layer 202 includes silicon oxide or silicon nitride.

Figure 3E:
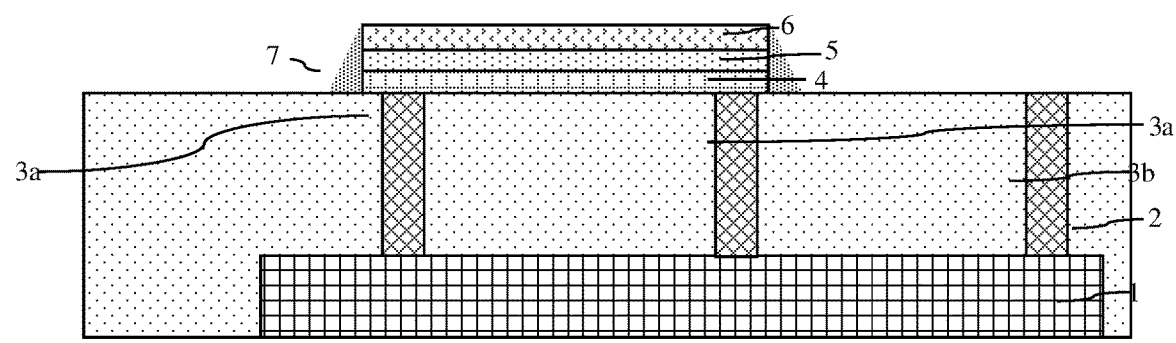

Referring to FIG. 3E, the side wall material layer 202 is fully etched to form a side wall 7 on the side face of the MIM capacitor.

Figure 3F:
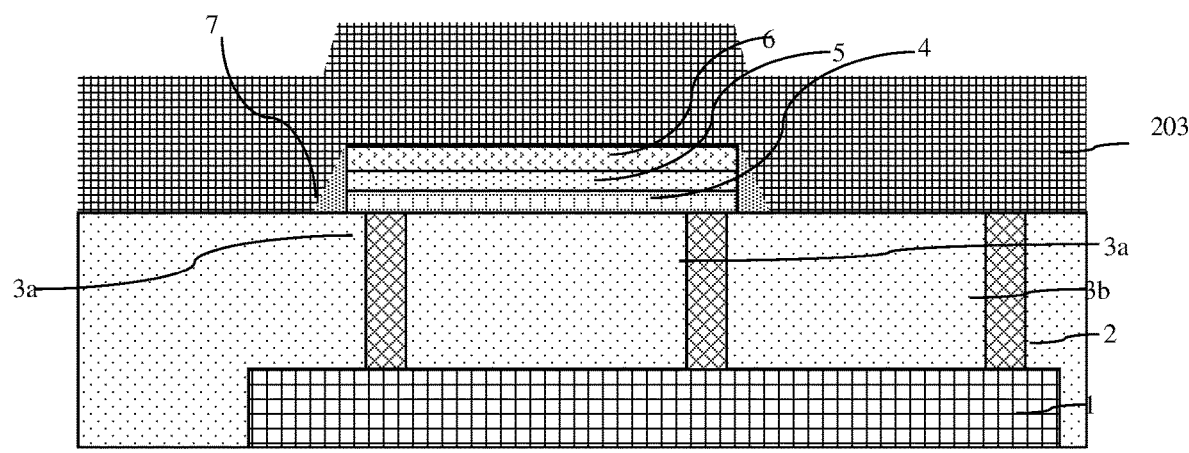

Step 7: Referring to FIG. 3F, a second front metal layer 203 is formed.

The metal material of the second front metal layer 203 includes Al or Cu.

Referring to FIG. 2, the second front metal layer 203 is patterned to form a second metal wire layer 8.

A patterned structure of the second metal wire layer 8 includes a lower electrode lead-out structure 8a and an upper electrode lead-out structure 8b.

The bottom of the lower electrode lead-out structure 8a is in contact with the second via 3b and connected to the first metal wire layer 1 by means of the second via 3b.

The upper electrode lead-out structure 8b covers the surface of the capacitor upper electrode 6 of the MIM capacitor and extends to the surface of the interlayer film 2 outside the MIM capacitor, and the upper electrode lead-out structure 8b is isolated from the capacitor lower electrode 4 by means of the side wall 7.

The present application is described in detail above via specific embodiments, but these embodiments are not intended to limit the present application. Without departing from the principle of the present application, those skilled in the art can still make many variations and improvements, which should also be considered to fall into the protection scope of the present application.

What is claimed is:

1. An MIM capacitor of an embedded structure, wherein the MIM capacitor is formed between a first metal wire layer and a second metal wire layer arranged in an upper-lower adjacent manner;
an interlayer film is formed between the first metal wire layer and the second metal wire layer;
the MIM capacitor is formed on the surface of the interlayer film and comprises a capacitor lower electrode, a capacitor insulating dielectric layer, and a capacitor upper electrode that are sequentially stacked;
the capacitor lower electrode is connected to the first metal wire layer by means of a first via passing through the interlayer film, the first metal wire layer extends to the outside of the capacitor lower electrode, and the first metal wire layer is connected, by means of a second via outside the capacitor lower electrode and passing through the interlayer film, to a lower electrode lead-out structure formed by the second metal wire layer;
a side wall is formed on a side face of the MIM capacitor;
a patterned structure of the second metal wire layer comprises the lower electrode lead-out structure and an upper electrode lead-out structure; and
the upper electrode lead-out structure covers the surface of the capacitor upper electrode of the MIM capacitor and extends to the surface of the interlayer film outside the MIM capacitor, and the upper electrode lead-out structure is isolated from the capacitor lower electrode by means of the side wall.

2. The MIM capacitor of an embedded structure according to claim 1, wherein the material of the capacitor lower electrode comprises metal or a conductive dielectric layer.

3. The MIM capacitor of an embedded structure according to claim 2, wherein the metal material of the capacitor lower electrode comprises Al, Cu, or TiN.

4. The MIM capacitor of an embedded structure according to claim 1, wherein the material of the capacitor insulating dielectric layer comprises silicon oxide or silicon nitride.

5. The MIM capacitor of an embedded structure according to claim 1, wherein the material of the capacitor upper electrode comprises metal.

6. The MIM capacitor of an embedded structure according to claim 5, wherein the metal material of the capacitor upper electrode comprises Al, Cu, or TiN.

7. The MIM capacitor of an embedded structure according to claim 1, wherein the metal material of the first metal wire layer comprises Al or Cu, and the metal material of the second metal wire layer comprises Al or Cu.

8. The MIM capacitor of an embedded structure according to claim 1, wherein the material of the interlayer film comprises silicon oxide or a low-K material layer; and
the material of the side wall comprises silicon oxide or silicon nitride.

9. A method for manufacturing an MIM capacitor of an embedded structure, comprising the following steps:

step 1: forming a first front metal layer on a semiconductor substrate, and patterning the first front metal layer to form a first metal wire layer;
step 2: forming an interlayer film on the semiconductor substrate on which the first metal wire layer is formed;
step 3: forming, in the interlayer film, vias passing through the interlayer film, the vias comprising a first via and a second via;
step 4: sequentially forming a capacitor lower electrode, a capacitor insulating dielectric layer, and a capacitor upper electrode on the surface of the interlayer film;
step 5: defining a formation region of an MIM capacitor by means of photolithography, and removing the capacitor upper electrode, the capacitor insulating dielectric layer, and the capacitor lower electrode outside the formation region of the MIM capacitor by means of an etching process, such that the capacitor upper electrode, the capacitor insulating dielectric layer, and the capacitor lower electrode remaining in the formation region of the MIM capacitor are stacked to form the MIM capacitor;
wherein the capacitor lower electrode is connected to the first metal wire layer by means of the first via; and
the second via is located on the top of the first metal wire layer extending to the outside of the capacitor lower electrode;
step 6: forming a side wall on a side face of the MIM capacitor; and
step 7: forming a second front metal layer, and patterning the second front metal layer to form a second metal wire layer;
wherein a patterned structure of the second metal wire layer comprises a lower electrode lead-out structure and an upper electrode lead-out structure;
the bottom of the lower electrode lead-out structure is in contact with the second via and connected to the first metal wire layer by means of the second via; and
the upper electrode lead-out structure covers the surface of the capacitor upper electrode of the MIM capacitor and extends to the surface of the interlayer film outside the MIM capacitor, and the upper electrode lead-out structure is isolated from the capacitor lower electrode by means of the side wall.

10. The method for manufacturing an MIM capacitor of an embedded structure according to claim 9, wherein the material of the capacitor lower electrode comprises metal or a conductive dielectric layer.

11. The method for manufacturing an MIM capacitor of an embedded structure according to claim 10, wherein the metal material of the capacitor lower electrode comprises Al, Cu, or TiN.

12. The method for manufacturing an MIM capacitor of an embedded structure according to claim 9, wherein the material of the capacitor insulating dielectric layer comprises silicon oxide or silicon nitride.

13. The method for manufacturing an MIM capacitor of an embedded structure according to claim 9, wherein the material of the capacitor upper electrode comprises metal.

14. The method for manufacturing an MIM capacitor of an embedded structure according to claim 13, wherein the metal material of the capacitor upper electrode comprises Al, Cu, or TiN.

15. The method for manufacturing an MIM capacitor of an embedded structure according to claim 9, wherein the metal materials of the first metal wire layer and the second metal wire layer are same and comprise Al or Cu;

the material of the interlayer film comprises silicon oxide or a low-K material layer;

the material of the side wall comprises silicon oxide or silicon nitride; and in step 1, the semiconductor substrate comprises a silicon substrate, a semiconductor device is formed in the semiconductor substrate, more than one layer of bottom interlayer film is formed in the semiconductor substrate before the first front metal layer is formed, and a corresponding bottom front metal layer is formed between the bottom interlayer films.

* * * * *